United States Patent
Kawano et al.

(10) Patent No.: US 7,262,486 B2
(45) Date of Patent: Aug. 28, 2007

(54) SOI SUBSTRATE AND METHOD FOR MANUFACTURING THE SAME

(75) Inventors: Masaya Kawano, Kanagawa (JP);
Tsutomu Tashiro, Kanagawa (JP);
Yoichiro Kurita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/154,514

(22) Filed: Jun. 17, 2005

(65) Prior Publication Data
US 2006/0001090 A1  Jan. 5, 2006

(30) Foreign Application Priority Data
Jun. 30, 2004  (JP) ............. 2004-194639

(51) Int. Cl.
*H01L 21/40* (2006.01)
(52) U.S. Cl. .............. 257/621; 257/501; 257/508; 257/524; 257/347; 257/E27.112; 257/E29.02; 257/E21.32; 257/E21.564; 438/479; 438/219
(58) Field of Classification Search .......... 257/621, 257/347, 501, 508, 524, E27.112, E29.02, 257/E21.32, E21.564; 438/479, 219
See application file for complete search history.

(56) References Cited

U.S. PATENT DOCUMENTS

| | | | |
|---|---|---|---|
| 6,576,957 B2 * | 6/2003 | Houston | 257/347 |
| 2002/0094615 A1 * | 7/2002 | Kunikiyo | 438/155 |
| 2004/0000685 A1 * | 1/2004 | Brown et al. | 257/305 |

FOREIGN PATENT DOCUMENTS

JP  2003-007909  1/2003

\* cited by examiner

*Primary Examiner*—George Fourson
*Assistant Examiner*—Julio J. Maldonado
(74) *Attorney, Agent, or Firm*—Young & Thompson

(57) ABSTRACT

The SOI substrate 1 has a supporting substrate 10, an insulating layer 20 formed on the supporting substrate 10 and a silicon layer 30 formed on the insulating layer 20. A through electrode 40 is provided in a device formation region A1 of the SOI substrate 1. The through electrode 40 reaches the insulating layer 20 from the silicon layer 30. Specifically, the through electrode 40 extends to an inner part of the insulating layer 20 originating from a surface of the silicon layer 30 while penetrating the silicon layer 30. Here, an end face 40a of the through electrode 40 at the insulating layer 20 side stops inside the insulating layer 20.

12 Claims, 6 Drawing Sheets

SOI SUBSTRATE AND METHOD FOR MANUFACTURING THE SAME

This application is based on Japanese patent application NO. 2004-194639, the content of which is incorporated hereinto by reference.

BACKGROUND OF THE INVENTION

1. Field of the Invention

The present invention relates to an SOI substrate and a method for manufacturing the SOI substrate, and a semiconductor device.

2. Description of Related Art

As for the conventional SOI (Silicon On Insulator) substrate, there is the SOI substrate, which is described in, for instance, the Japanese Laid-Open Patent Publication No. 2003-7909 (FIG. 57). The SOI substrate described in the Japanese Laid-Open Patent Publication No. 2003-7909 (FIG. 57) has an insulating layer and a silicon layer formed on the insulating layer. A through electrode is formed in this SOI substrate, and the through electrode penetrates through both the silicon layer and the insulating layer. That is, the through electrode is formed so that an end face of the through electrode at the insulating layer side should project from the insulating layer. Accordingly, the through electrode reaches a supporting substrate in a state where the supporting substrate is provided on a lower face (opposite face to the silicon layer) of the insulating layer.

SUMMARY OF THE INVENTION

However, in the structure where the through electrode projects from the insulating layer described above, the through electrode is prone to receive damage of some kind, when the supporting substrate is stripped in the manufacturing process of a semiconductor device provided with the above SOI substrate. Therefore, the SOI substrate described in the Japanese Laid-Open Patent Publication No. 2003-7909 (FIG. 57) has a room for improvement in connection with reliability.

According to the present invention, there is provided a SOI substrate which has an insulating layer and a silicon layer provided on the insulating layer comprising: a through electrode reaching the insulating layer from the silicon layer, wherein an end face of the through electrode at the insulating layer side stops inside the insulating layer.

In this SOI substrate, the end face of the through electrode at the insulating layer side stops inside the insulating layer. That is, the structure results in a state where the end face does not project from the insulating layer. Therefore, the through electrode is not prone to receive damage when a supporting substrate is stripped in the manufacturing process of a semiconductor device provided with the SOI substrate. Consequently, the SOI substrate with high reliability is realized.

The insulating layer may also include an etch-stop film. Thereby, it is possible to realize easily structure in which the above end face of the through electrode stops inside the insulating layer.

The etch-stop film may be composed of SiN. Thereby, it is possible to make the etch-stop film to function as a metal diffusion preventing film preventing hard metal or the like from being diffused. Moreover, in this case, the insulating layer may include a silicon oxide film provided at the opposite side to the silicon layer of the etch-stop film. In this case, it is possible to realize more easily the structure in which the above end face of the through electrode stops inside the insulating layer depending on an etching selection ratio between the silicon nitride film and the silicon oxide film.

Thickness of the insulating layer may also be not less than 100 nm and not more than 800 nm. When thickness of the insulating layer is not less than 100 nm, it is possible to secure sufficiently a coverage state of the insulating layer. In some cases, when thickness of the insulating layer is too large, a warp of the SOI substrate occurs. In this point, when the thickness is not more than 800 nm, it is possible to suppress sufficiently the warp.

The above SOI substrate may comprise a polysilicon plug provided in the silicon layer. Thereby, it is possible to make the polysilicon plug to function as gettering site of an impurity. The polysilicon plug may come into contact with a side face of the through electrode.

According to the present invention, there is also provided a semiconductor device comprising the above SOI substrate. The SOI substrate, as described above, has high reliability because the through electrode is not prone to receive damage when the supporting substrate is stripped. Consequently, also in the semiconductor device, high reliability is obtained.

According to the present invention, there is provided a method for manufacturing an SOI substrate, comprising: forming a through electrode in such a way that a hole or a trench reaching an insulating layer from a silicon layer is formed in an SOI wafer having a supporting substrate, the insulating layer provided on the supporting substrate and the silicon layer provided on the insulating layer, followed by embedding a conductive film into the hole or the trench, wherein, in the step of forming the through electrode, the through electrode is formed so that an end face of the through electrode at the insulating layer side should stop inside the insulating layer.

In the manufacturing method, the through electrode is formed so that the end face of the through electrode at the insulating layer side should stop inside the insulating layer. That is, the through electrode is formed so that the end face should not project from the insulating layer. Thereby, the through electrode is not prone to receive damage when the support substrate is stripped in the manufacturing process of the semiconductor device provided with the SOI substrate. Consequently, according to the manufacturing method, it is possible to obtain the SOI substrate with high reliability.

According to the present invention, there can be realized the SOI substrate with high reliability and the method for manufacturing the same, and the semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposed.

There will be described a preferred embodiment of an SOI substrate and a method for manufacturing the same, and a semiconductor device according to the present invention in detail with reference to the drawings below. It should be noted that, in the explanation of the drawings, the same sign is given to the same component and repetitive explanation is omitted.

Figure 1:
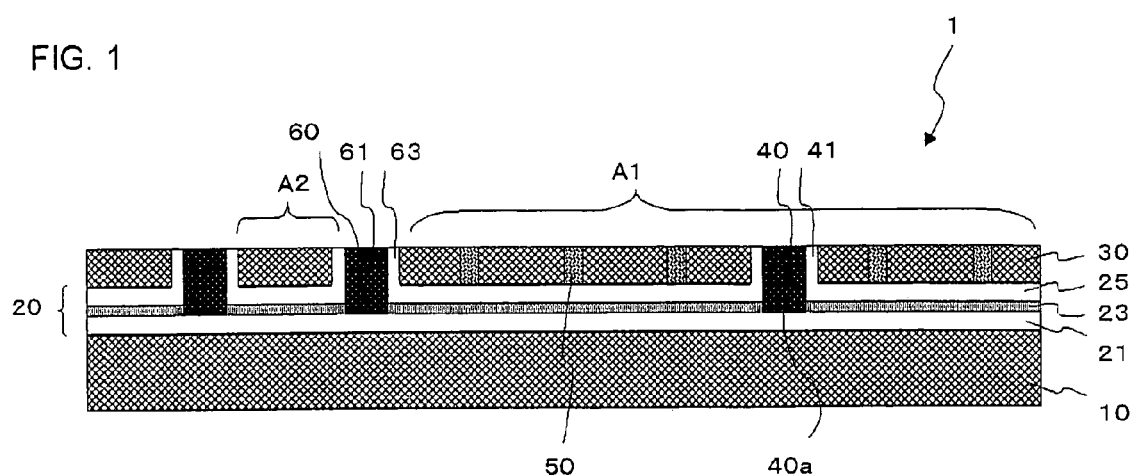
FIG. 1 is a cross-sectional view showing one embodiment of an SOI substrate according to the present invention.
Figure 2:
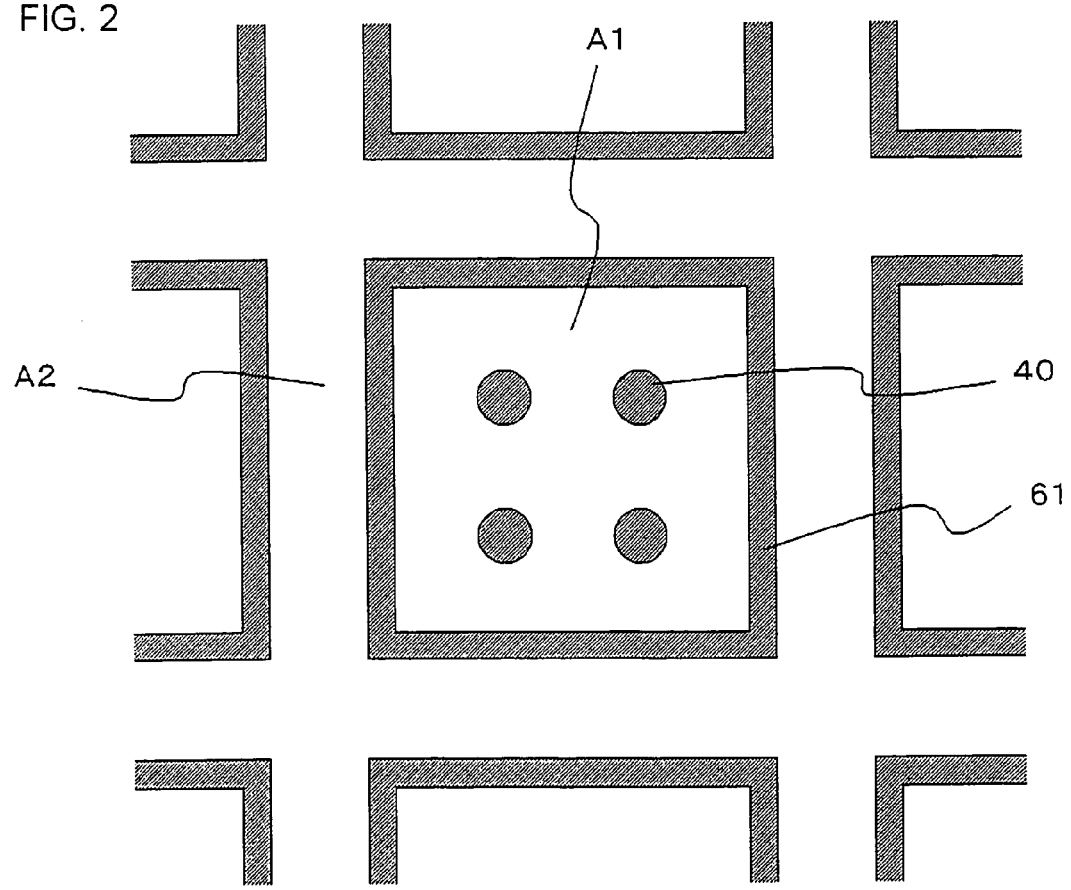
FIG. 2 is a plan view showing one embodiment of the SOI substrate according to the present invention.

FIG. 1 is a cross-sectional view showing one embodiment of the SOI substrate according to the present invention. In addition, FIG. 2 is a plan view showing one embodiment of the SOI substrate according to the present invention. The SOI substrate 1 is constituted in such a way that there are a supporting substrate 10, an insulating layer 20 formed on the supporting substrate 10 and a silicon layer 30 formed on the insulating layer 20. In the present embodiment, a silicon substrate is used as the supporting substrate 10.

The insulating layer 20 includes a silicon oxide film 21 (the first silicon oxide film), a silicon nitride film 23, and a silicon oxide film 25 (the second silicon oxide film). That is, the insulating layer 20 is constituted as a multilayered insulating film in which these silicon oxide film 21, silicon nitride film 23 and silicon oxide film 25 are sequentially formed from the supporting substrate 10 side. The silicon nitride film 23 intervening between the silicon oxide films 21, 25 functions as an etch-stop film and also as a metal diffusion preventing film preventing diffusion of heavy metal or the like. The silicon oxide film 21 and the silicon oxide film 25 are, for instance, $SiO_2$ film. The silicon nitride film 23 is, for instance, SiN film. It should be noted that SiCN film or SiON film, or a combination of these films may be used instead of the silicon nitride film 23 or together with the silicon nitride film 23. In addition, it is preferable that thickness of the insulating layer 20 is not less than 100 nm and not more than 800 nm.

The through electrode 40 is provided in a device formation region (circuit formation region) A1 of the SOI substrate 1. The through electrode 40 reaches the insulating layer 20 from a silicon layer 30. Specifically, the through electrode 40 extends to an inner part of the insulating layer 20 originating from a surface of the silicon layer 30 while penetrating the silicon layer 30. Here, an end face 40a of the through electrode 40 at the insulating layer 20 side stops inside the insulating layer 20. In other words, the through electrode 40 is partially embedded in the insulating layer 20. In the present embodiment, the position of the end face 40a approximately agrees with a face (that is, a face of the opposite side to the silicon layer 30) of the silicon nitride film 23 at the supporting substrate 10 side. For instance, Cu, W, Al or poly-silicon can be used as materials of the through electrode 40. A side face of the through electrode 40 is covered with insulating films 41 such as $SiO_2$ or the like.

In addition, a polysilicon plug 50 is provided in the device formation region A1. The polysilicon plug 50 is formed in such a way as to penetrate the silicon layer 30. In the present embodiment, a plurality of the polysilicon plugs 50 is provided.

A trench 60 is provided along a boundary between the device formation region A1 and a scribe line region A2. The trench 60 reaches the insulating layer 20 while penetrating the silicon layer 30. And, as shown in FIG. 2, the trench 60 is provided so as to surround the whole side face of the device formation region A1. A conductive film 61 is embedded inside the trench 60. For instance, the same material as that of the through electrode 40 is used as the material of this conductive film 61. In addition, both the inner peripheral surface and the outer peripheral surface of the conductive film 61 are covered with the insulating film 63. It should be noted that the insulating film 41, polysilicon plug 50 and the insulating film 63 are not shown in FIG. 2.

There will be described one example of a method for manufacturing the SOI substrate 1 as one embodiment of the method for manufacturing the SOI substrate according to the present invention while referring to FIG. 3 and FIG. 4. Firstly, $SiO_2$, SiN and $SiO_2$ are sequentially formed on the first silicon wafer to be the supporting substrate 10, into a layered structure. It is preferable that the multilayered insulating film is formed to have the thickness of not less than 100 nm and not more than 800 nm. A second silicon wafer to be a silicon layer 30 is laminated to the first silicon wafer, followed by annealing it under vacuum. Accordingly, an SOI wafer in which the insulating layer 20 and the silicon layer 30 are formed on the supporting substrate 10 is obtained (FIG. 3).

Figure 3:
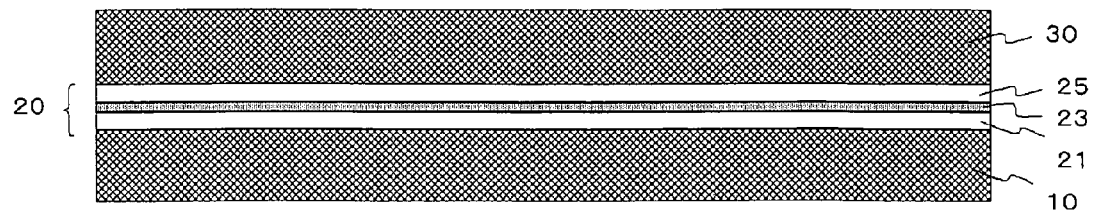
FIG. 3 is a step chart showing one embodiment of a method for manufacturing the SOI substrate according to the present invention.
Figure 4:
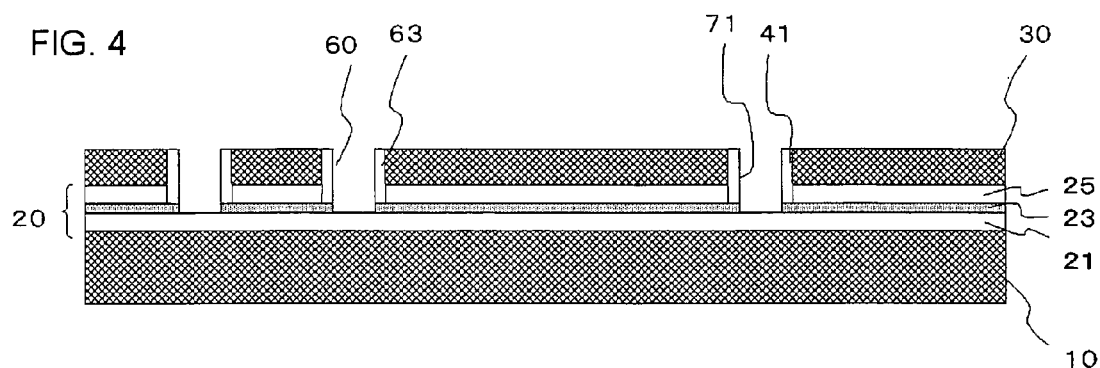
FIG. 4 is a step chart showing one embodiment of a method for manufacturing the SOI substrate according to the present invention.

Next, a hole 71 for the through electrode 40 reaching the insulating layer 20 from the silicon layer 30 is formed at a predetermined position of the SOI wafer shown in FIG. 3 by using, for instance, the dry etching. At this time, an etching condition is determined so that the etching should stop at the boundary between the silicon oxide film 21 and the silicon nitride film 23 in order that the end face 40a (referring to FIG. 1) of the through electrode 40 stops inside the insulating layer 20. In the present example, also the trench 60 is formed in the same time as the hole 71. Further, the insulating film 41 and the insulating film 63 are formed by heat oxidization of the silicon layer 30 in this condition (FIG. 4). It should be noted that the hole 71 may be a trench.

Successively, the through electrode 40 is formed by embedding the conductive film into the hole 71 (through electrode formation process). In the present example, the conductive film is also embedded into the trench 60 at the same time as the hole 71. Specifically, film of Cu, W or Al is formed by plating or CVD, after a barrier metal of TiN, TaN or Ta or the like is formed. Further, the conductive film formed except inside the hole 71 or the trench 60, and the insulating film on the silicon layer 30 are stripped. In addition, the polysilicon plug 50 is formed at a predetermined position of the silicon layer 30. In such a way as above, the SOI substrate 1 shown in FIG. 1 is obtained.

Figure 5:
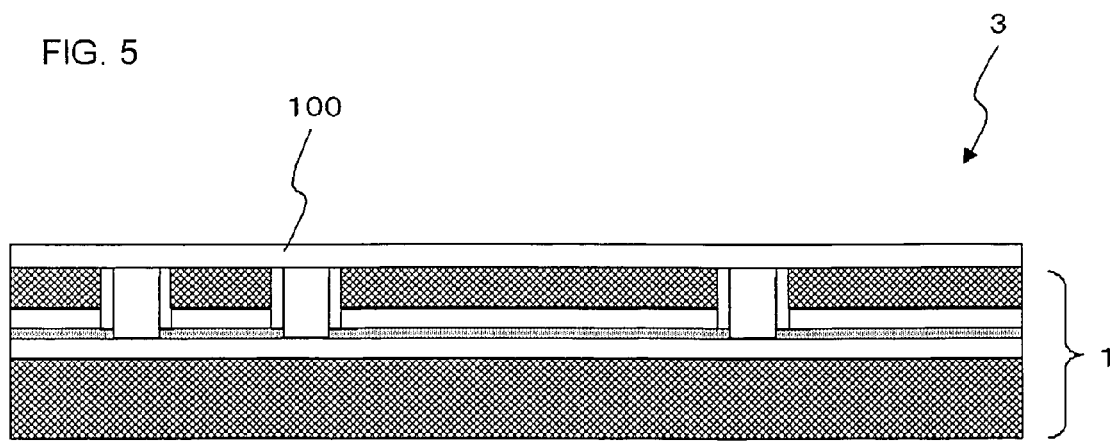
FIG. 5 is a step chart showing one example of the method for manufacturing a semiconductor device comprising the SOI substrate of FIG. 1.

Furthermore, there will be described one example of the method for manufacturing the semiconductor device comprising the SOI substrate 1 while referring to FIGS. 5 to 9. Firstly, necessary devices are formed on the device formation region A1 of the SOI substrate 1. After that, the scribe line region A2 is diced. Thereby, a plurality of semiconductor chips 3 provided with an interconnection layer 100 on the SOI substrate 1 are obtained (FIG. 5). It should be noted that the interconnection layer 100 may include various kinds of circuit elements such as an electrode terminal, and various kinds of passive elements and the like in addition to the interconnection.

Figure 6:
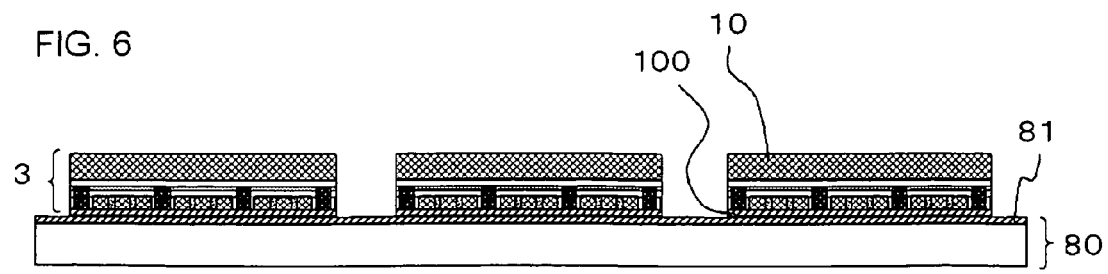
FIG. 6 is a step chart showing one example of the method for manufacturing a semiconductor device comprising the SOI substrate of FIG. 1.

Next, a base wafer 80 having the interconnection layer 81 on the surface is prepared, and the semiconductor chip 3 is fixed thereon (FIG. 6). At this time, the interconnection layers 81, 100 are made to face each other. It is possible to use, for instance, a surface activation joining method for the joining between the base wafer 80 and the semiconductor chip 3. In the method, the joining surface of the base wafer 80 and the semiconductor chip 3 are flattened by a CMP method (Chemical Mechanical Polishing method) or the like. Then, the opposite electrodes and the opposite insulating films are joined to each other in the state that those are activated by plasma irradiation or the like. It should be noted that it is suitable to perform the joining between electrodes and the resin sealing while using the general flip chip joining method. In the present example, a plurality of semiconductor chips 3 is put on the base wafer 80 at a predetermined interval. This interval is set larger than thickness of a dicing blade used in a process for dicing the base wafer 80 at the later process.

Figure 7:
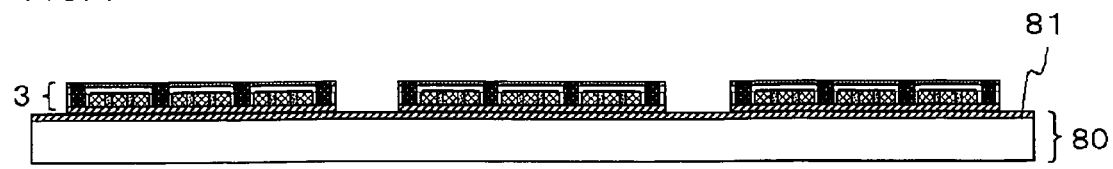
FIG. 7 is a step chart showing one example of the method for manufacturing a semiconductor device comprising the SOI substrate of FIG. 1.

Successively, the supporting substrate 10 is stripped from the SOI substrate 1 by using, for instance, wet etching (supporting substrate stripping process). At this time, also the silicon oxide film 21 is stripped together with the supporting substrate 10 so that the end face 40a of the through electrode 40 is exposed (FIG. 7). It should be noted that, in the supporting substrate stripping process, it is suitable to strip the supporting substrate 10 by the grinding or CMP, or combination thereof in addition to the wet etching.

Figure 8:
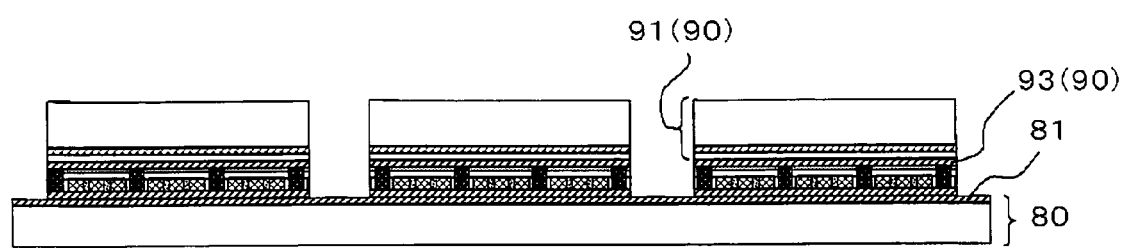
FIG. 8 is a step chart showing one example of the method for manufacturing a semiconductor device comprising the SOI substrate of FIG. 1.

Further, there is prepared the second semiconductor chip 90 in which an interconnection layer 93 is provided on the SOI substrate 91. The second semiconductor chip 90 is fixed on the semiconductor chip 3. At this time, the interconnection layer 93 is made to face the semiconductor chip 3 (FIG. 8).

Figure 9:
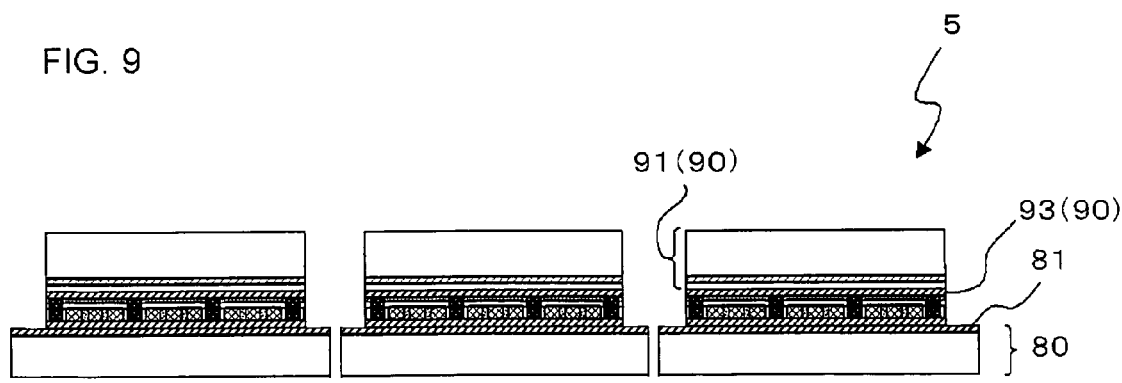
FIG. 9 is a step chart showing one example of the method for manufacturing a semiconductor device comprising the SOI substrate of FIG. 1.

Lastly, the semiconductor device 5 comprising the SOI substrate 1 is obtained upon dicing the region of the base wafer 80 where the semiconductor chip 3 is not provided (FIG. 9).

There will be described the effect of the present embodiment. In the present embodiment, the end face 40a of the through electrode 40 stops inside the insulating layer 20. That is, the structure results in a state where the end face 40a does not project from the insulating layer 20. Therefore, the through electrode 40 is not prone to receive damage when the supporting substrate 10 is stripped in the supporting substrate stripping process. Consequently, the SOI substrate 1 with high reliability and the semiconductor device provided with the SOI substrate 1 are realized.

The insulating layer 20 includes the silicon nitride film 23 functioning as the etch-stop film. For this reason, it is possible to easily realize structure in which the end face 40a of the through electrode 40 stops inside the insulating layer 20. In the case that SiN is used as the silicon nitride film 23, the effect brought from the metal diffusion preventing film of the silicon nitride film 23 particularly becomes remarkable. In addition, the insulating film 20 is capable of functioning suitably as the metal diffusion preventing film also when including the SiON film or the SiCN film.

The insulating layer 20 includes the silicon oxide film 21. Thereby, it is possible to more easily realize structure in which the end face 40a of the through electrode 40 stops inside the insulating film 20, depending on an etching selection ratio between the silicon nitride film 23 and the silicon oxide film 21.

Further, in the present embodiment, there is provided the silicon oxide film 25. Also, the silicon oxide film 25 functions as the metal diffusion preventing film. Consequently, the insulating layer 20, which has multilayered film structure composed of the silicon oxide film 21, the silicon nitride film 23 and the silicon oxide film 25, achieves an especially superior function in connection with etching stop and metal diffusion prevention. However, in the present embodiment, it is not always necessary that the insulating layer 20 has the multilayered film structure. Also, the insulating layer 20 may be 2 layered structure composed of, for instance, the silicon oxide film 21 and the silicon nitride film 23. Or, the insulating layer 20 may be single layer structure composed of only the silicon oxide film 21.

When thickness of the insulating layer 20 is made to be not less than 100 nm, it is possible to secure sufficiently a coverage state of the insulating layer 20. In addition, when the thickness is not more than 800 nm, it is possible to suppress sufficiently a warp of the SOI substrate 1.

Figure 10:
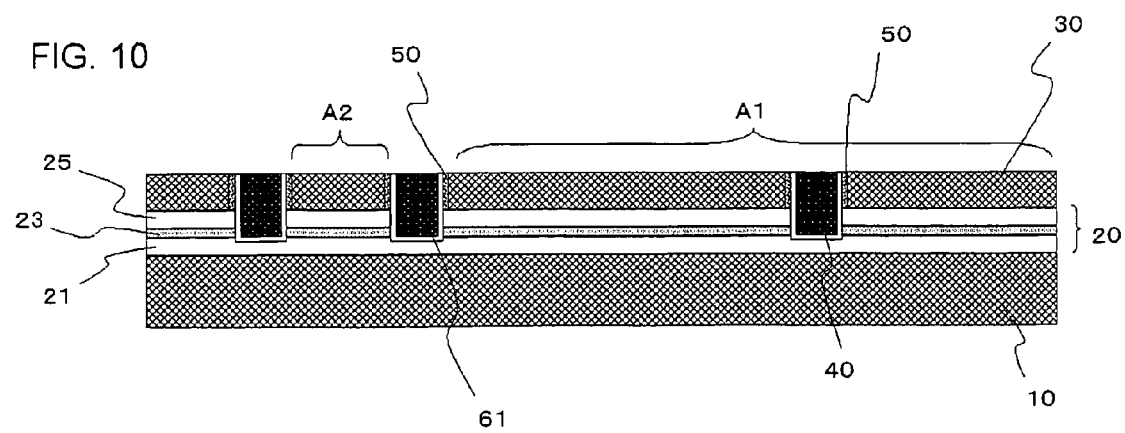
FIG. 10 is a view illustrating a modified example of the SOI substrate of FIG. 1.

There is provided a polysilicon plug 50 in the silicon layer 30. Thereby, gettering impurities are performed by the polysilicon plug 50 in the SOI substrate 1. It should be noted that, as shown in FIG. 10, the polysilicon plug 50 may be provided while coming into contact with the side face of the through electrode 40. In the same drawing, the polysilicon plug 50 is provided while coming into contact with also the side face of the conductive film 61. However, it is not always necessary that the polysilicon plug 50 is provided.

The conductive film 61 and the insulating film 63 are provided so as to surround the whole side face of the device formation region A1 in the silicon layer 30. Thereby, even though heavy metal or the like attaches to the side face of the chip, it is possible to prevent the heavy metals or the like from being diffused to inside the device formation region A1 with these conductive film 61 and insulating film 63. Consequently, reliability of the SOI substrate 1 is further improved. Moreover, in the above embodiment, the conductive film 61 and the insulating film 63 are formed with the same process as that of the through electrode 40. Thereby, it is possible to obtain the SOI substrate 1 provided with the conductive film 61, the insulating film 63 and the through electrode 40 without increasing the number of processes. However, it is not always necessary to provide the conductive film 61 and the insulating film 63. Either of these films may be provided, or neither of these films may be provided.

Figure 11:
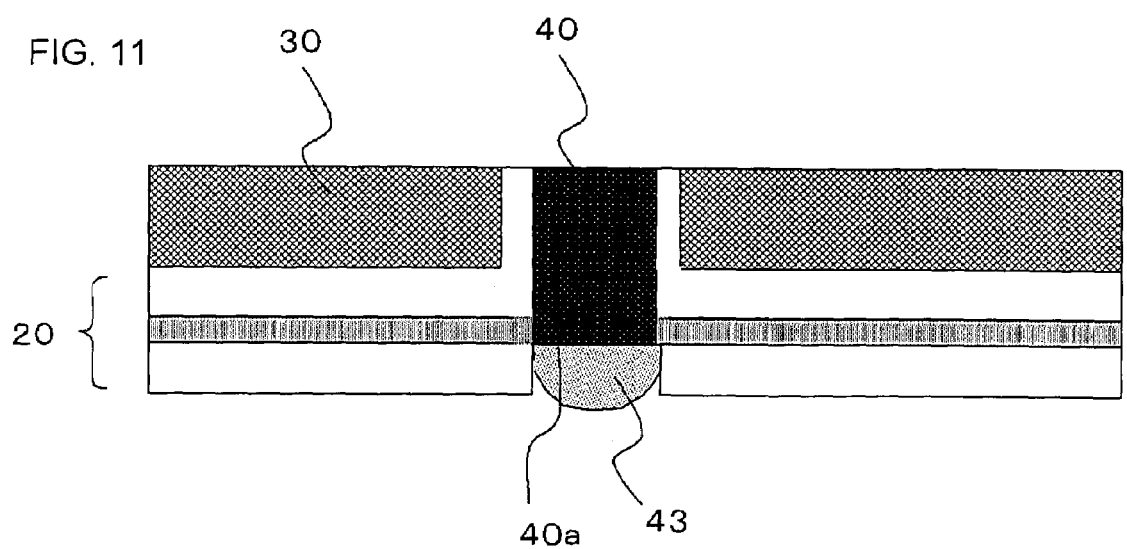
FIG. 11 is a view illustrating a modified example of the SOI substrate of FIG. 1.

It should be noted that, in the above embodiment, there has been shown the example in which the end face 40a of the through electrode 40 approximately agrees with the surface of the SOI substrate 1, in the SOI substrate 1 after the above described supporting substrate 10 is stripped (referring to FIG. 7 or the like) However, as shown in FIG. 11, the end face 40a may cave in to the surface of the SOI substrate 1. In the same drawing, solder 43 is provided on the end face 40a. There resides a part (projected part) projecting from the surface of the SOI substrate 1 and a part (non projected part) not projecting from the surface of the SOI substrate 1 at the surface of the solder 43. Specifically, the mid section of the surface of the solder 43 projects from the surface of the SOI substrate 1, while the verge section of the surface of the solder 43 stops within the insulating layer 20 without projecting from the surface of the SOI substrate 1.

Figure 12:
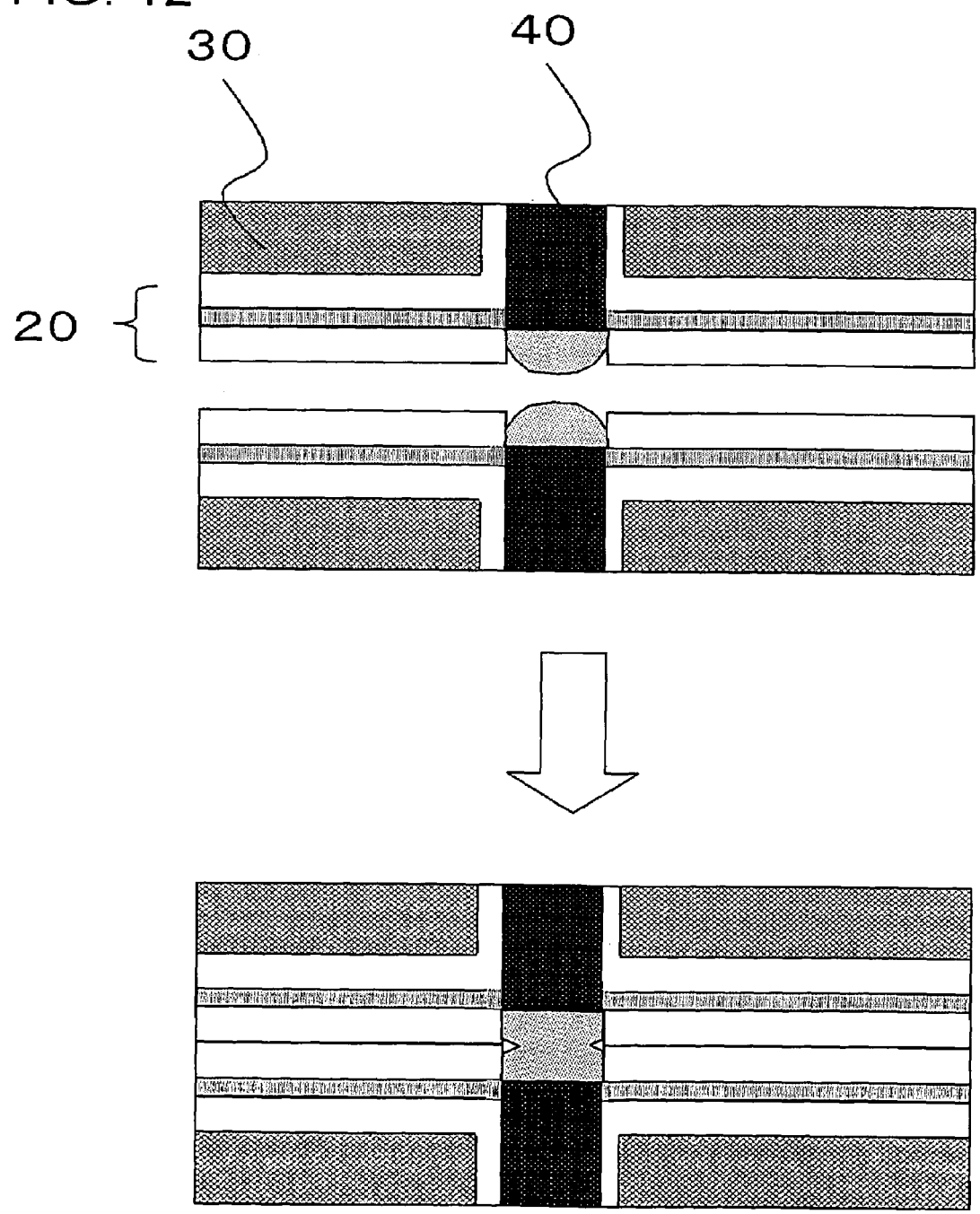
FIG. 12 is a view illustrating a modified example of the SOI substrate of FIG. 1.

FIG. 12 shows a state where the SOI substrates 1 with structure shown in FIG. 11 are joined each other. As described above, the non-projected part is provided on the surface of the solder 43. Thereby, this part becomes a relief of an electrode material after joining. Thus, it is possible to join appropriately the whole surface of the SOI substrate 1.

Figure 13:
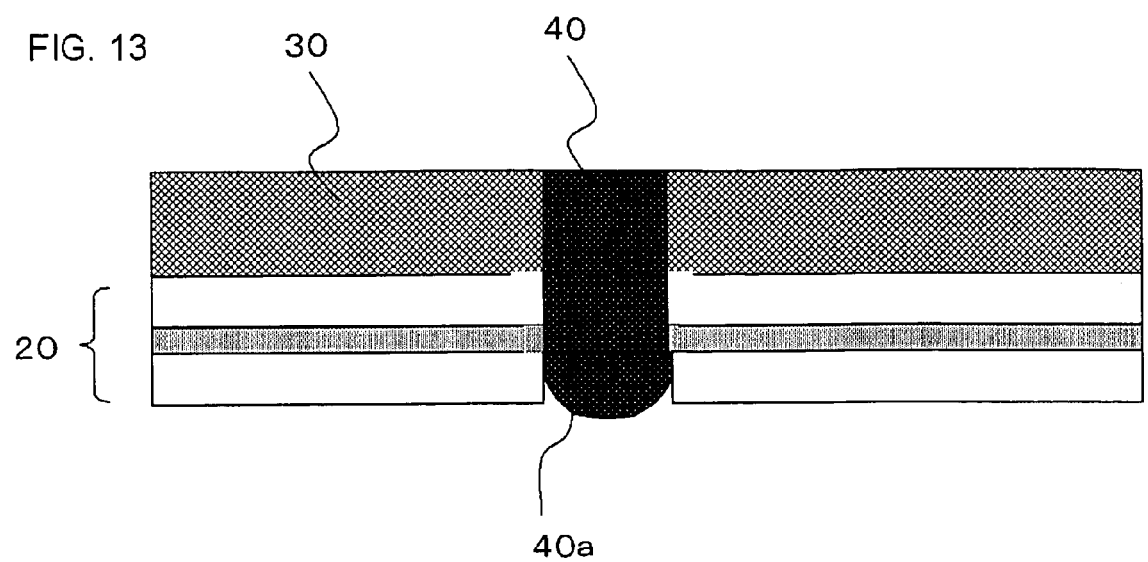
FIG. 13 is a view illustrating a modified example of the SOI substrate of FIG. 1.

Moreover, as shown in FIG. 13, also it is suitable to form the through electrode 40 so as to have both the projected part and the non-projected part at the end face 40a. The shape of the through electrode 40 in the same drawing is the same as the shape where, in FIG. 11, the through electrode 40 is added to the solder 43. That is, in FIG. 13, the constitution results in a state where part of the end face 40a of the through electrode 40 stops inside the insulating layer 20. Also, in this case, the through electrode 40 can hardly be damaged when stripping the supporting substrate 10, as compared with the case where the whole end face projects from the insulating layer.

As for the semiconductor device comprising the SOI substrate 1, without limiting to the semiconductor device 5 shown in FIG. 9, the semiconductor device, whatever the kind, may be suitable as long as it comprises the SOI substrate 1. For instance, also an interposer comprising the SOI substrate 1 is included in one embodiment of the semiconductor device according to the present invention. The interposer is, in the layered type semiconductor device, for instance provided between a logic LSI and a DRAM. In such a layered type semiconductor device, it is possible to realize the electrical connection between the logic LSI and the DRAM depending on the through electrode of the interposer. For this reason, there is obtained the effect of improvement of the processing speed and lowering of the power consumption and the like as compared with the case where the electrical connection between those is realized depending on a wire bonding or the like.

It is apparent that the present invention is not limited to the above embodiment, and that may be modified or changed without departing from the scope and sprit of the invention.

What is claimed is:

1. An SOI substrate which has an insulating layer and a silicon layer on said insulating layer comprising:
   a through electrode reaching said insulating layer from said silicon layer, wherein said insulating layer includes an etch-stop film, and
   wherein an end face of said through electrode at said insulating layer side stops inside said insulating layer while said through electrode penetrates through said etch-stop film.

2. The SOI substrate according to claim 1, wherein said etch-stop film is composed of SiN.

3. The SOI substrate according to claim 2, wherein said insulating layer includes a silicon oxide film provided on an opposite side of said silicon layer from said etch-stop film.

4. The SOI substrate according to claim 1, wherein the thickness of said insulating layer is not less than 100 nm and not more than 800 nm.

5. The SOI substrate according to claim 1, further comprising a polysilicon plug in said silicon layer.

6. The SOI substrate according to claim 5, wherein said polysilicon plug is in contact with a side face of said through electrode.

7. An SOI substrate which has an insulating layer and a silicon layer on said insulating layer comprising:
   a through electrode penetrating said silicon layer and partially embedded in said insulating layer,
   wherein said insulating layer includes an etch-stop film, and
   wherein an end face of said through electrode at said insulating layer side stops inside said insulating layer while said through electrode penetrates through said etch-stop film.

8. The SOI substrate according to claim 7, wherein said insulating layer includes a first insulating film and a second insulating film; and
   said etch-stop film is disposed between said first insulating film and said second insulating film.

9. The SOI substrate according to claim 8, wherein said first insulating film and said second insulating film are composed of silicon oxide.

10. The SOI substrate according to claim 9, wherein said etch-stop film is composed of SiN.

11. The SOI substrate according to claim 7, further comprising a polysilicon plug provided in said silicon layer.

12. The SOI substrate according to claim 11, wherein said polysilicon plug is in contact with a side face of said through electrode.

* * * * *